(12) United States Patent
Suzuki et al.

(10) Patent No.: US 12,270,611 B2
(45) Date of Patent: Apr. 8, 2025

(54) SANDWICH STRUCTURE AND METHOD FOR MANUFACTURING SAME

(71) Applicant: TORAY INDUSTRIES, INC., Tokyo (JP)

(72) Inventors: Takafumi Suzuki, Nagoya (JP); Takumi Honda, Iyo-gun (JP); Masato Honma, Iyo-gun (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 17/772,600

(22) PCT Filed: Nov. 11, 2020

(86) PCT No.: PCT/JP2020/042007
§ 371 (c)(1),
(2) Date: Apr. 28, 2022

(87) PCT Pub. No.: WO2021/106561
PCT Pub. Date: Jun. 3, 2021

(65) Prior Publication Data
US 2022/0404106 A1 Dec. 22, 2022

(30) Foreign Application Priority Data
Nov. 29, 2019 (JP) ................... 2019-216114

(51) Int. Cl.
*F28D 21/00* (2006.01)
*B29C 70/42* (2006.01)
(Continued)

(52) U.S. Cl.
CPC ............. *F28D 21/00* (2013.01); *B32B 5/024* (2013.01); *B32B 5/263* (2021.05); *B29C 70/42* (2013.01);
(Continued)

(58) Field of Classification Search
CPC ............. F28D 21/00; F28D 2021/0029; B32B 5/024; B32B 5/263; B32B 2250/40;
(Continued)

(56) References Cited

U.S. PATENT DOCUMENTS

| | | | |
|---|---|---|---|
| 5,093,197 A * | 3/1992 | Howard | H01M 50/417 428/394 |
| 2012/0094106 A1* | 4/2012 | Honma | B29C 65/08 428/299.1 |

(Continued)

FOREIGN PATENT DOCUMENTS

| | | |
|---|---|---|
| DE | 10 2014 006 751 A1 | 3/2015 |
| JP | 2002-38033 A | 2/2002 |

(Continued)

OTHER PUBLICATIONS

Espacenet Translation of JP2008230237A (Year: 2023).*
(Continued)

*Primary Examiner* — Michael Zhang
(74) *Attorney, Agent, or Firm* — Birch, Stewart, Kolasch & Birch, LLP

(57) ABSTRACT

The purpose of the present invention is to provide a sandwich structure that has both excellent heat dissipation properties and excellent mechanical properties. In order to achieve this purpose, the sandwich structure of the present invention has the following structure. The sandwich structure includes a core member (I), and a fiber reinforced member (II) disposed on both sides of the core member (I), wherein the core member (I) includes a sheet-shaped heat conductive member (III) having an in-plane thermal conductivity of 300 W/m·K or more.

12 Claims, 5 Drawing Sheets

(51) Int. Cl.
  *B29C 70/68* (2006.01)
  *B29K 63/00* (2006.01)
  *B29K 307/04* (2006.01)
  *B32B 5/02* (2006.01)
  *B32B 5/26* (2006.01)

(52) U.S. Cl.
  CPC .......... *B29C 70/68* (2013.01); *B29K 2063/00* (2013.01); *B29K 2307/04* (2013.01); *B29K 2995/0013* (2013.01); *B32B 2250/20* (2013.01); *B32B 2250/40* (2013.01); *B32B 2260/023* (2013.01); *B32B 2260/046* (2013.01); *B32B 2262/106* (2013.01); *B32B 2307/546* (2013.01); *B32B 2307/732* (2013.01); *F28D 2021/0029* (2013.01)

(58) Field of Classification Search
  CPC ........ B32B 2260/023; B32B 2260/046; B32B 2262/106; B32B 2307/546; B32B 2307/732
  See application file for complete search history.

(56) References Cited

U.S. PATENT DOCUMENTS

| | | | |
|---|---|---|---|
| 2015/0232732 A1* | 8/2015 | DiBattista | F21V 29/15 252/75 |
| 2015/0375480 A1 | 12/2015 | Kutsumizu et al. | |
| 2016/0016378 A1 | 1/2016 | Oikawa et al. | |
| 2022/0388204 A1* | 12/2022 | Suzuki | B29C 70/12 |

FOREIGN PATENT DOCUMENTS

| | | | | |
|---|---|---|---|---|
| JP | 2006049878 | A | * | 2/2006 |
| JP | 2007-44994 | A | | 2/2007 |
| JP | 2008230237 | A | * | 10/2008 |
| JP | 2010-64391 | A | | 3/2010 |
| JP | 5107191 | B2 | * | 12/2012 |
| JP | 2016-22685 | A | | 2/2016 |
| JP | 2016-28880 | A | | 3/2016 |
| JP | 2017-69341 | A | | 4/2017 |
| WO | WO 2015/119064 | A1 | | 8/2015 |
| WO | WO-2019212051 | A1 | * | 11/2019 |

OTHER PUBLICATIONS

Espacenet Translation of JP-5107191-B2 (Year: 2023).*
Espacenet Translation of WO-2019212051-A1 (Year: 2023).*
International Search Report, issued in PCT/JP2020/042007, dated Jan. 19, 2021.
Written Opinion of the International Searching Authority, issued in PCT/JP2020/042007, dated Jan. 19, 2021.
Chinese Office Action and Search Report dated Sep. 27, 2023 for Application No. 202080081146.7.
Partial Supplementary European Search Report for European Application No. 20893360.6, dated Nov. 27, 2023.
Chinese Office Action and Search Report for Chinese Application No. 202080081146.7, dated Sep. 14, 2024, with a partial English translation.
Rui, "Concise Electricians' Handbook," China Planning Press, Aug. 2015, 8 pages total, with an English translation.

* cited by examiner

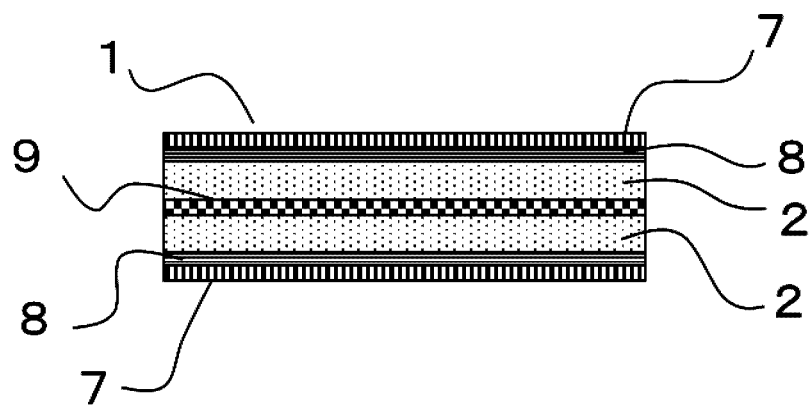
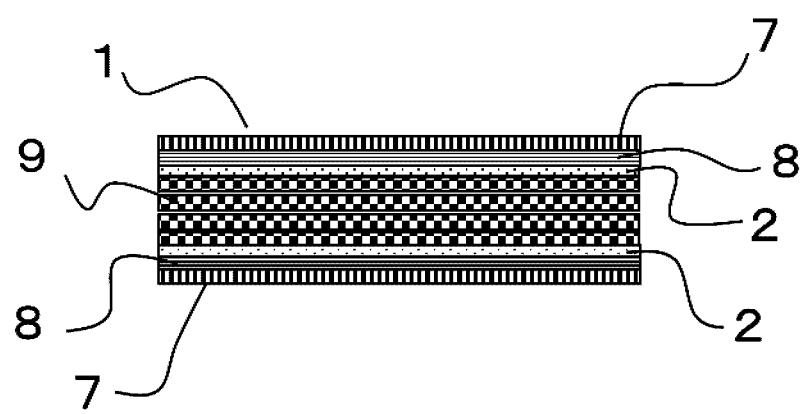

SANDWICH STRUCTURE AND METHOD FOR MANUFACTURING SAME

TECHNICAL FIELD

The present invention relates to a sandwich structure and a method for manufacturing the sandwich structure.

BACKGROUND ART

In recent years, market demands for heat dissipation are increasing year by year for industrial products such as automobiles, aircraft, and electronic equipment. In order to meet these demands, molded articles having high thermal conductivity are widely used for various industrial applications. Among such molded articles, a sandwich structure including a thermally conductive member having high thermal conductivity has an excellent heat dissipation property and an excellent mechanical property, and therefore is expected to be used in each product. In particular, a sandwich structure including a thermally conductive member and a high-strength member has been widely studied.

Patent Document 1 describes an invention of a sandwich structure including a laminate of a thermally conductive member and a rigid retaining member. Patent Document 1 describes that the lamination of a thermally conductive member and a rigid retaining member can provide a sandwich structure having both excellent thermal conductivity and excellent rigidity.

Patent Document 2 describes an invention of a sandwich structure including a laminate of a graphite sheet having excellent thermal conductivity and support sheets on both surfaces of the graphite sheet, and including a sealing spacer that has a thickness substantially equal to that of the graphite sheet and is attached to at least one end face of the graphite sheet. Patent Document 2 describes that attaching the sealing spacer to the periphery of the graphite sheet gives effects of imparting excellent thermal conductivity and excellent mechanical strength, preventing the graphite powder from separating from the end face, imparting an excellent handling property without a knife-shaped edge, and suppressing delamination.

Patent Document 3 describes an invention of a housing having high thermal conductivity in which a laminated body of graphite sheets is covered with a resin layer. Patent Document 3 describes that delamination between the graphite films can be prevented by covering the end of the graphite sheets with the resin.

PRIOR ART DOCUMENTS

Patent Documents

Patent Document 1: International Publication No. 2016/002457
Patent Document 2: Japanese Patent Laid-open Publication No. 2007-44994
Patent Document 3: Japanese Patent Laid-open Publication No. 2006-95935

SUMMARY OF THE INVENTION

Problems to be Solved by the Invention

In the sandwich structure in Patent Document 1, all ends of the thermally conductive member are exposed, and therefore the strength of the thermally conductive member is insufficient. If the bonding strength between the thermally conductive member and the rigid retaining member is insufficient, the sandwich structure may delaminate from the end.

In the sandwich structure in Patent Document 2, the end of the graphite sheet is protected by the sealing spacer. However, adjustment of the thickness and the position of the sealing spacer is complicated, and thus the processability is low. If the bonding strength between the sealing spacer and the support sheets is insufficient, the sandwich structure may delaminate from the end.

In the housing having high thermal conductivity in Patent Document 3, the surface and the end of the graphite sheets are covered with the resin to protect the graphite sheets. However, the protection with the resin results in low rigidity and low strength.

The present invention has been made in view of the above problems, and an object of the present invention is to provide a sandwich structure having both an excellent heat dissipation property and an excellent mechanical property.

Solutions to the Problems

In order to solve the above problems, the sandwich structure of the present invention has the following configuration.

A sandwich structure including a core member (I), fiber-reinforced members (II) disposed on both surfaces of the core member (I) respectively, and a thermally conductive member (III) having a sheet form in the core member (I) and having an in-plane thermal conductivity of 300 W/m·K or more.

Effects of the Invention

According to the present invention, a sandwich structure having both an excellent heat dissipation property and an excellent mechanical property can be obtained even if, in the sandwich structure, the thermally conductive member has an insufficient strength, or the thermally conductive member and the material to protect the thermally conductive member are insufficiently bonded to each other.

BRIEF DESCRIPTION OF THE DRAWINGS

FIG. 6 is a schematic sectional view of a sandwich structure produced in Comparative Example 1.

FIG. 7 is a schematic sectional view of a sandwich structure produced in Comparative Example 2.

EMBODIMENTS OF THE INVENTION

Hereinafter, the present invention will be described in detail.

<Sandwich Structure>

The sandwich structure in the present description is a structure including a core member and surface materials that have a higher elastic modulus than the core member and are disposed on both surfaces of the core member. In the sandwich structure of the present invention, the core member is a core member (I) containing a thermally conductive member (III) having a sheet form, and the surface materials are fiber-reinforced members (II). The term "member having a sheet form" refers to a thin and wide member, and means a member having a thickness of 0.01 μm or more and 10 mm or less and an aspect ratio of the width to the thickness of 10 or more.

The core member (I) contains the thermally conductive member (III) having a sheet form (hereinafter, sometimes simply referred to as thermally conductive member (III)). The phrase "the core member (I) contains the thermally conductive member (III)" as used herein means that the thermally conductive member (III) is present as a part of the layer of the core member (I) in the laminated structure of the sandwich structure.

Figure 1:
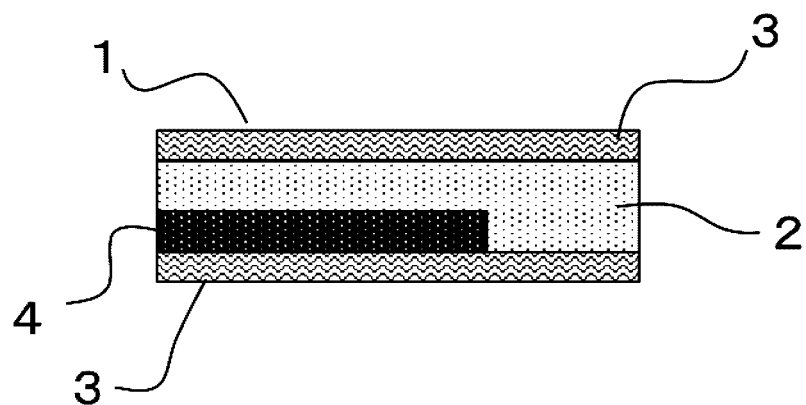
FIG. 1 is a schematic view illustrating one embodiment of a sandwich structure of the present invention.
Figure 2:
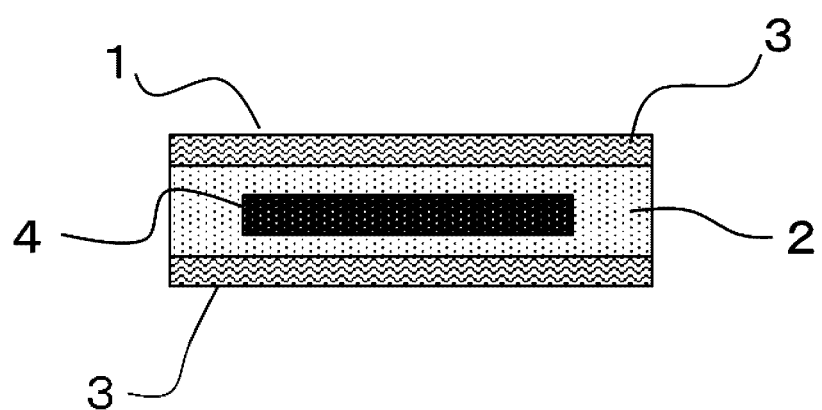
FIG. 2 is a schematic view illustrating another embodiment of a sandwich structure of the present invention.

It can be said that the core member (I) contains the thermally conductive member (III), for example, in an aspect in which a core member (I) 2 covers one end face (right end face in FIG. 1) and one surface (upper surface in FIG. 1) of a thermally conductive member (III) 4 as in FIG. 1, or in an aspect in which a core member (I) 2 covers both surfaces (both of the surfaces) and all end faces of a thermally conductive member (III) 4, that is, the core member (I) contains the thermally conductive member (III) inside as in FIG. 2. An aspect as in FIG. 6 is excluded from the concept that "the core member (I) contains the thermally conductive member (III)". In such an aspect, all end faces of a thermally conductive member (III) (graphite sheet 9) are exposed, that is, the thermally conductive member (III) is considered to form an independent layer singly. The thermally conductive member (III) contained in the core member (I) as described above can be prevented from destroying because the core member (I) bears the stress applied to the sandwich structure to suppress transmission of the stress to the thermally conductive member (III).

The core member (I) preferably covers at least two end faces of the thermally conductive member (III), more preferably further covers both surfaces of the thermally conductive member (III), and still more preferably covers both surfaces and all end faces of the thermally conductive member (III), that is, contains the thermally conductive member (III) inside.

In the present invention, the core member (I) may cover the thermally conductive member (III) with another member such as an adhesive or a cushioning member interposed therebetween. Between the core member (I) and the thermally conductive member (III), a gap may be present.

However, in the present invention, at least one end face of the thermally conductive member (III) is preferably in direct contact with the core member (I) without another member interposed therebetween. Furthermore, at least one surface of the thermally conductive member (III) is preferably in contact with the core member (I). If the thermally conductive member (III) is in direct contact with the core member (I) as described above, the heat transmitted from the surface of the sandwich structure can be quickly transmitted from the core member (I) to the thermally conductive member (III).

In the present invention, the thermally conductive member (III) is preferably not bonded to the core member (I). In order to bond the thermally conductive member (III) and the core member (I) to each other, an adhesive is generally to be interposed therebetween. Thus, the proportion of the thermally conductive member (III) to the sandwich structure reduces according to the amount of the adhesive, and as a result, the heat dissipation property of the sandwich structure deteriorates. If the thermally conductive member (III) is not bonded to the core member (I), a large proportion of the stress applied to the sandwich structure is borne by the core member (I), and thus transmission of the stress to the thermally conductive member (III) is suppressed, and the thermally conductive member (III) can be prevented from destroying.

The sandwich structure of the present invention preferably has a flexural rigidity per unit width of 0.5N·m or more, more preferably 1.0N·m or more, and still more preferably 1.5N·m or more. The sandwich structure having a higher flexural rigidity per unit width is more preferable, and therefore the upper limit of the flexural rigidity per unit width is not particularly limited, but is usually about 1,000 N·m. By setting the flexural rigidity per unit width within the above-described range, the sandwich structure becomes a rigid structure, and can be suitably used in a housing or the like. The flexural rigidity per unit width can be calculated with the following equation from the elastic modulus of the sandwich structure, E (Pa), the second moment of area, I ($m^4$), and the width of the sandwich structure, b (m).

$$\text{Flexural rigidity per unit width}(N \cdot m) = E(Pa) \times I\ (m^4)/b\ (m)$$

In a case where the sandwich structure has a rectangular section, the second moment of area of the rectangular section, I, is $bh^3/12$ ($m^4$), and can be calculated with the following equation.

$$\text{Flexural rigidity per unit width}(N \cdot m) = E(Pa) \times h^3(m^3)/12$$

Examples of the method for setting the flexural rigidity per unit width within the above-described range include a method in which the fiber-reinforced member (II) is used as a surface material as in the sandwich structure of the present invention. The examples also include a method in which a thick sandwich structure is used.

The sandwich structure of the present invention preferably has a maximum thickness of 0.3 mm or more and 3.0 mm or less, and more preferably 0.5 mm or more and 1.5 mm or less. Using a thin sandwich structure gives an effect of weight reduction, but a sandwich structure thinner than 0.3 mm may lack rigidity.

[Thermally Conductive Member (III)]

In the present invention, the thermally conductive member (III) has a sheet form, and has an in-plane thermal conductivity of 300 W/m·K or more. The thermally conductive member (III) preferably has an in-plane thermal conductivity of 500 W/m·K or more, and more preferably 1,000 W/m·K or more. A higher in-plane thermal conductivity is more preferable, and therefore the upper limit of the in-plane thermal conductivity is not particularly limited, but known thermally conductive members have an in-plane thermal conductivity of about 2,000 W/m·K. If the thermally conductive member (III) has an in-plane thermal conductivity of 300 W/m·K or more, the thermal diffusion in the sandwich structure is excellent in the in-plane direction, and thus the sandwich structure has an excellent heat dissipation property. The in-plane thermal conductivity of the thermally conductive member (III) can be measured with a laser flash method in which a sample is set in a sample holder for in-plane measurement, and the size of the sample is set to about 20 to 30 mm in diameter and 1.0 mm or less in thickness. In measurement of a material that is less likely to absorb laser light, a blackening film is thinly and uniformly formed on the sample surface. In measurement of a material having a low emissivity at a wavelength at a measurement temperature of an infrared detector, the sample back surface is treated in the same manner.

The material of the thermally conductive member (III) is not particularly limited as long as the in-plane thermal conductivity is 300 W/m·K or more, and examples of the usable material include ceramics, metals, graphite, highly thermally conductive resins in which a highly thermally conductive filler is added to a resin to enhance the thermal conductivity.

The thermally conductive member (III) preferably includes a thermally conductive sheet selected from the group consisting of graphite sheets, metal sheets, and ceramic sheets, and more preferably consists of a thermally conductive sheet selected from the group consisting of graphite sheets, metal sheets, and ceramic sheets. Examples of the ceramic sheets include silica, zirconia, alumina, boron nitride, silicon carbide, and silicon nitride sheets. Examples of the metal sheets include titanium, aluminum, magnesium, iron, silver, gold, platinum, copper, and nickel sheets, and sheets consisting of an alloy containing a metal described above as a main component.

The metal sheets are relatively inexpensive. In particular, the copper sheet is inexpensive and excellent in thermal conductivity, and therefore is preferable from the viewpoint of raw material cost. The graphite sheet has a small specific gravity and excellent thermal conductivity, and therefore is particularly preferable in the present invention from the viewpoint of improving the lightweight and heat dissipation properties of the sandwich structure.

Examples of the graphite sheet include sheets obtained by mixing and molding a graphite powder and a binder resin, sheets obtained by rolling expanded graphite, sheets obtained by laminating a substrate with carbon atoms with a chemical vapor deposition (CVD) method using a hydrocarbon-based gas and then annealing the laminate, and sheets obtained by graphitizing a film of a polymer compound. Among the graphite sheets, the sheets obtained by graphitizing a film of a polymer compound are preferable because of their very high thermal conductivity.

In the present invention, the thermally conductive member (III) preferably includes a laminated structure of a plurality of the thermally conductive sheets, and more preferably is a laminated structure of a plurality of the thermally conductive sheets. In particular in a graphite sheet, the orientation of the graphene structure in the sheet affects the thermal conductivity, and a thinner graphite sheet generally has higher thermal conductivity. Therefore, in the case of using a graphite sheet as the thermally conductive sheet, the heat dissipation property of the sandwich structure can be improved by using a laminated structure of a plurality of sheets as the thermally conductive member (III). In this case, the plurality of the thermally conductive sheets included in the thermally conductive member (III) are preferably in direct contact with each other without an adhesive or the like interposed therebetween. If the thermally conductive sheets are indirect contact with each other, the proportion of the thermally conductive member (III) to the sandwich structure can be increased to improve the heat dissipation property of the sandwich structure. If the thermally conductive sheets are in direct contact with each other, the heat diffusion in the out-of-plane direction is also excellent. The number of the thermally conductive sheets in the laminate is preferably 2 or more and 10 or less, and more preferably 3 or more and 5 or less. Increasing the number of the sheets in the laminate improves the heat dissipation property of the sandwich structure. However, if the number of the sheets in the laminate is excessively increased, the processability deteriorates.

The thermally conductive member (III) preferably has an average thickness of 0.01 μm or more and 2.0 mm or less, more preferably 5 μm or more and 1.0 mm or less, and still more preferably 15 μm or more and 0.5 mm or less. If the thermally conductive member (III) has an excessively small average thickness, the heat dissipation property of the sandwich structure deteriorates, and if the thermally conductive member (III) has an excessively large average thickness, the sandwich structure is heavy. In the method of measuring the average thickness of the thermally conductive member (III), the thicknesses of nine points in the thermally conductive member (III) are measured to one decimal place using a micrometer, and the average of the thicknesses is regarded as the average thickness. The measurement points are set at three points in each line in the longitudinal direction and three points in each line in the lateral direction, that is, nine points in total so that the interval between each point and its adjacent point or the sample end is uniform in the longitudinal and lateral directions.

[Core Member (I)]

In the present invention, the core member (I) preferably includes a porous body, and the core member (I) is more preferably a porous body. The core member (I) including a porous body is advantageous from the viewpoint of the lightweight property of the sandwich structure. When the core member (I) contains the thermally conductive member (III), the core member (I) as a porous body crushes or swells in the out-of-plane direction, and thus the core member (I) can contain the thermally conductive member (III) without positional displacement of the thermally conductive member (III). In a case where the core member (I) is a porous body, the core member (I) preferably has a volume content of voids of 10% or more and 85% or less, more preferably 20% or more and 85% or less, and from the viewpoint of achieving both lightweight and mechanical properties, still more preferably 50% or more and 80% or less based on the apparent volume of the core member (I).

The material of the core member (I) is not particularly limited, and for example, a fiber-reinforced resin reinforced with continuous fibers or discontinuous fibers is preferably used. The continuous reinforcing fiber refers to a reinforcing fiber continuous at least over a length of 15 mm or more, preferably 100 mm or more in one direction. As the fiber-reinforced resin reinforced with continuous fibers, a unidirectional fiber-reinforced resin or a woven fiber-reinforced resin can be used. As the fiber-reinforced resin reinforced with discontinuous fibers, a short fiber-reinforced resin or a long fiber-reinforced resin can be used. As a non-fiber-reinforced resin, a resin sheet, a resin foam, or the like can also be used.

In a case where the core member (I) includes a resin, the resin is not particularly limited whether it is a fiber-reinforced resin or a non-fiber-reinforced resin, and the resin may be a thermosetting resin or a thermoplastic resin. Examples the thermoplastic resin include thermoplastic resins selected from crystalline resins such as "polyesters such as polyethylene terephthalate (PET), polybutylene terephthalate (PBT), polytrimethylene terephthalate (PTT), polyethylene naphthalate (PEN), and liquid crystal polyesters, polyolefins such as polyethylene (PE), polypropylene (PP), and polybutylene, polyoxymethylene (POM), polyamide (PA), polyarylene sulfides such as polyphenylene sulfide (PPS), polyketone (PK), polyether ketone (PEK), polyether ether ketone (PEEK), polyether ketone ketone (PEKK), polyether nitrile (PEN), and fluorine-based resins such as polytetrafluoroethylene", amorphous resins such as "in addition to styrene-based resins, polycarbonate (PC), polymethyl methacrylate (PMMA), polyvinyl chloride (PVC), polyphenylene ether (PPE), polyimide (PI), polyamideimide (PAI), polyetherimide (PEI), polysulfone (PSU), polyether sulfone, and polyarylate (PAR)", in addition, phenol-based resins, phenoxy resins, further, polystyrene-based, polyolefin-based, polyurethane-based, polyester-based, polyamide-based, polybutadiene-based, polyisoprene-based, and fluorine-based resins, acrylonitrile-based and other thermoplastic elastomers, and copolymers and modified products thereof. Among them, polyolefins are preferable from the viewpoint of the lightweight property of the sandwich structure to be obtained. In particular in a case where the core member (I) includes a porous body, polyolefins are preferable in view of the synergic lightweight effect. From the viewpoint of strength, polyamides are preferable. In particular in a case where the core member (I) consists of a fiber-reinforced resin, polyamides are preferable from the viewpoint of interfacial bonding strength between the reinforcing fiber and the resin. Examples of the thermosetting resin include unsaturated polyester resins, vinyl ester resins, epoxy resins, phenol (resole) resins, a urea resin, a melamine resin, polyimide resins, a maleimide resin, a benzoxazine resin, and resins obtained by blending two or more of these resins. In particular in a case where the core member (I) consists of a fiber-reinforced resin, epoxy resins are preferably used from the viewpoint of interfacial bonding strength between the reinforcing fiber and the resin.

An additive may be added to the resin according to the application, and examples of the additive include fillers such as mica, talc, kaolin, hydrotalcite, sericite, bentonite, xonotlite, sepiolite, smectite, montmorillonite, wollastonite, silica, calcium carbonate, glass beads, glass flakes, glass microballoons, clay, molybdenum disulfide, titanium oxide, zinc oxide, antimony oxide, calcium polyphosphate, graphite, barium sulfate, magnesium sulfate, zinc borate, calcium borate, aluminum borate whisker, potassium titanate whisker, and polymer compounds, conductivity imparting materials such as metal-based and metal oxide-based conductivity imparting materials, carbon black, and a graphite powder, halogen-based flame retardants such as brominated resins, antimony-based flame retardants such as antimony trioxide and antimony pentoxide, phosphorus-based flame retardants such as ammonium polyphosphate, aromatic phosphates, and red phosphorus, organic acid metal salt-based flame retardants such as boric acid metal salts, carboxylic acid metal salts, and aromatic sulfonimide metal salts, inorganic flame retardants such as zinc borate, zinc, zinc oxide, and zirconium compounds, nitrogen-based flame retardants such as cyanuric acid, isocyanuric acid, melamine, melamine cyanurate, melamine phosphate, and nitrogenated guanidine, fluorine-based flame retardants such as PTFE, silicone-based flame retardants such as polyorganosiloxanes, metal hydroxide-based flame retardants such as aluminum hydroxide and magnesium hydroxide, other flame retardants, flame retardant aids such as cadmium oxide, zinc oxide, cuprous oxide, cupric oxide, ferrous oxide, ferric oxide, cobalt oxide, manganese oxide, molybdenum oxide, tin oxide, and titanium oxide, pigments, dyes, lubricants, mold release agents, compatibilizers, dispersants, crystal nucleating agents such as mica, talc, and kaolin, plasticizers such as phosphate esters, heat stabilizers, antioxidants, coloration preventing agents, ultraviolet absorbers, fluidity modifiers, foaming agents, antibacterial agents, vibration controlling agents, deodorants, sliding modifiers, and antistatic agents such as polyether ester amides. In particular in the applications including electrical and electronic equipment, automobiles, and aircraft, flame retardancy may be required, and phosphorus-based flame retardants, nitrogen-based flame retardants, and inorganic flame retardants are preferably added.

The amount of the flame retardant is preferably 1 to 20 parts by mass with respect to 100 parts by mass of the resin, in order to keep a good balance of properties such as the mechanical properties of the resin used and resin fluidity during molding along with exhibition of flame retardant effect. The amount is more preferably 1 to 15 parts by mass.

The core member (I) preferably has a specific gravity of 0.01 to 1.5 from the viewpoint of the lightweight property of the sandwich structure. The specific gravity is more preferably 0.1 to 1.3, and still more preferably 0.3 to 1.1. The specific gravity can be measured by cutting out the core member (I) and measuring it in accordance with ISO 1183 (1987) or ISO 0845 (1988).

In a case where the core member (I) is a fiber-reinforced material, the kind of the included reinforcing fiber is not particularly limited, and examples of the usable reinforcing fiber include carbon fibers, glass fibers, aramid fibers, alumina fibers, silicon carbide fibers, boron fibers, metal fibers, natural fibers, and mineral fibers. These may be used alone or in combination of two or more. Among them, polyacrylonitrile (PAN)-based, pitch-based, and rayon-based carbon fibers are preferably used from the viewpoints of high specific strength, high specific rigidity, and a weight reduction effect. Moreover, glass fibers can be preferably used from the viewpoint of enhancing the economic efficiency of the sandwich structure to be obtained, and combination use of a carbon fiber and a glass fiber is particularly preferable from the viewpoint of a balance between the mechanical property and the economic efficiency. Furthermore, aramid fibers can be preferably used from the viewpoint of enhancing the impact absorption property and the formability of the sandwich structure to be obtained, and combination use of a carbon fiber and an aramid fiber is particularly preferable from the viewpoint of a balance between the mechanical property and the impact absorption property. In addition, reinforcing fibers coated with a metal such as nickel, copper, or ytterbium and pitch-based carbon fibers can also be used from the viewpoint of enhancing the conductivity of the sandwich structure to be obtained.

The reinforcing fiber is preferably surface-treated with a sizing agent from the viewpoint of improving the mechanical property. Examples of the sizing agent include polyfunctional epoxy resins, acrylic acid-based polymers, polyhydric alcohols, and polyethyleneimines. Specific examples of the sizing agent include polyglycidyl ethers of an aliphatic polyhydric alcohol such as glycerol triglycidyl ether, diglycerol polyglycidyl ether, polyglycerol polyglycidyl ether, sorbitol polyglycidyl ether, arabitol polyglycidyl ether, trimethylolpropane triglycidyl ether, and pentaerythritol polyglycidyl ether, polyacrylic acid, copolymers of acrylic acid and methacrylic acid, copolymers of acrylic acid and maleic acid, mixtures of two or more thereof, polyvinyl alcohol, glycerol, diglycerol, polyglycerol, sorbitol, arabitol, trimethylolpropane, pentaerythritol, and polyethyleneimine including more amino groups in one molecule. Among these sizing agents, glycerol triglycidyl ether, digylcerol polyglycidyl ether, and polyglycerol polyglycidyl ether are preferably used because they include many highly reactive epoxy groups in one molecule, have high water solubility, and are easy to apply.

In a case where the core member (I) in the present invention includes a porous body, the porous body particularly preferably consists of a fiber-reinforced resin. The reinforcing fibers in the fiber-reinforced resin may be continuous fibers or discontinuous fibers, but are preferably discontinuous fibers, and more preferably have a structure in which the discontinuous fibers forma three-dimensional network and are bonded to each other with a resin at their intersections. Bonding the discontinuous fibers to each other with a resin increases the shear modulus of the core member (I) to increase the rigidity of the sandwich structure. Hereinafter, this aspect will be described.

In the fiber-reinforced resin, the discontinuous fibers are preferably present as less than 500 of fine-denier strands, and more preferably dispersed in a single fiber form. The discontinuous fibers preferably have a fiber length of 1 to 50 mm, and more preferably 3 to 30 mm. If the fiber length is 1 mm or more, the reinforcing effect by the discontinuous fibers can be efficiently exhibited. If the fiber length is 50 mm or less, the dispersion of the discontinuous fibers can be well maintained.

The proportion of the number of bonding portions in which single fibers of the discontinuous fibers are bonded to each other with a resin is 50% or more, more preferably 70% or more, and still more preferably 90% or more with respect to the number of all intersecting portions in which the discontinuous fibers intersect each other.

The mass proportion of the discontinuous fibers is preferably 5 to 60% by mass, more preferably 10 to 50% by mass, and still more preferably 15 to 40% by mass with respect to the entire core member (I) from the viewpoint of achieving both a mechanical property and moldability.

In the fiber-reinforced resin, the surface of the discontinuous fibers is preferably coated with a resin at a coverage ratio of 30% or more, more preferably 50% or more, and still more preferably 80% or more. With such a coverage ratio, the core member (I) can have high rigidity. The coverage ratio is measured by observing a section of the core member (I) with a scanning electron microscope (SEM) and distinguishing the reinforcing fibers from the resin.

[Fiber-Reinforced Member (II)]

In the present invention, the fiber-reinforced member (II) is a member that constitutes the surface material of the sandwich structure, has a higher elastic modulus than the core member (I), and includes a reinforcing fiber.

The material of the fiber-reinforced member (II) is not particularly limited as long as the fiber-reinforced member (II) has a larger elastic modulus than the core member (I), and may be a fiber-reinforced resin reinforced with continuous fibers or may be a fiber-reinforced resin reinforced with discontinuous fibers. As the fiber-reinforced resin reinforced with continuous fibers, a unidirectional fiber-reinforced resin or a woven fiber-reinforced resin can be used. As the fiber-reinforced resin reinforced with discontinuous fibers, a short fiber-reinforced resin or a long fiber-reinforced resin can be used. From the viewpoint of the mechanical property of the sandwich structure, a continuous fiber-reinforced member is preferably used, and in particular, a unidirectional fiber-reinforced member is more preferably used. From the viewpoint of the shaping property of the sandwich structure, a discontinuous fiber-reinforced material can be suitably used. The matrix resin of the fiber-reinforced resin is not particularly limited. As the matrix resin, any of thermosetting resins and thermoplastic resins can be used, and the same resins as those included in the examples described for the core member (I) can be used. To the matrix resin, an additive may be added, and examples of the additive include the additives included in the examples described for the core member (I).

The kind of the reinforcing fibers included in the fiber-reinforced member (II) is not particularly limited, and the same reinforcing fibers as those included in the examples described for the core member (I) can be used.

The mass proportion of the reinforcing fibers in the fiber-reinforced member (II) is preferably 30 to 90% by mass, more preferably 40 to 80% by mass, and still more preferably 50 to 70% by mass with respect to 100% by mass of the fiber-reinforced member (II) from the viewpoint of achieving both a mechanical property and moldability. The range may be from any lower limit to any upper limit described above.

In the sandwich structure of the present invention, the fiber-reinforced member (II) preferably includes a carbon fiber-reinforced resin, and more preferably consists of a carbon fiber-reinforced resin. The carbon fiber-reinforced resin consists of carbon fibers and a matrix resin. With the fiber-reinforced member (II) consisting of a carbon fiber-reinforced resin, a sandwich structure having an excellent lightweight property, excellent rigidity, and excellent strength is easily obtained. Among carbon fibers, pitch-based carbon fibers having a high elastic modulus and high thermal conductivity are more preferable. By using the pitch-based carbon fibers, improvement in the rigidity and the heat dissipation property of the sandwich structure can be expected.

The fiber-reinforced member (II) may have a laminated structure including a laminate of a plurality of the members as described above.

<Method for Manufacturing Sandwich Structure>

The sandwich structure of the present invention can be preferably manufactured with any one of the following methods [1] to [3].

Method [1]: A method for manufacturing the sandwich structure of the present invention, including, in order described below, the steps of disposing a precursor of the core member (I) on at least one surface and at least one end face of the thermally conductive member (III) and heat-pressing the precursor and the thermally conductive member (III), and bonding the fiber-reinforced members (II) to both surfaces of the core member (I) respectively.

Method [2]: A method for manufacturing the sandwich structure of the present invention, including, in order described below, the steps of disposing a precursor of the core member (I) on at least one surface and at least one end face of the thermally conductive member (III), disposing precursors of the fiber-reinforced members (II) on both surfaces of the precursor of the core member (I) respectively, and heat-pressing the precursor of the core member (I), the thermally conductive member (III), and the precursors of the fiber-reinforced members (II).

Method [3]: A method for manufacturing the sandwich structure of the present invention, including, in order described below, the steps of disposing a precursor of the core member (I) on at least one surface and at least one end face of the thermally conductive member (III) and heat-pressing the precursor and the thermally conductive member (III), disposing precursors of the fiber-reinforced members (II) on both surfaces of the core member (I) respectively, and heat-pressing the core member (I), the thermally conductive member (III), and the precursors of the fiber-reinforced members (II).

In the methods [1] to [3], the phrase "disposing a precursor of the core member (I) on at least one surface and at least one end face of the thermally conductive member (III)" means disposing a precursor of the core member (I) so that the precursor covers at least one surface and at least one end face of the thermally conductive member (III).

In the methods [1] to [3], the precursor of the core member (I) is preferably disposed on both surfaces of the thermally conductive member (III). In the methods [1] to [3], the precursor of the core member (I) is more preferably disposed on at least two end faces of the thermally conductive member (III), still more preferably further disposed on both surfaces of the thermally conductive member (III), and particularly preferably disposed on both surfaces and all end faces of the thermally conductive member (III), that is, the precursor particularly preferably contains the thermally conductive member (III) inside.

The precursor of the core member (I) refers to, for example, a prepreg including reinforcing fibers and a resin in a case where the core member (I) is a fiber-reinforced resin. In a case where the core member (I) is a non-fiber-reinforced resin, examples of the precursor include resin sheets containing a foaming agent, and laminated bodies of resin sheets.

In a preferable aspect, of the present invention, in which the core member (I) includes a porous body consisting of a fiber-reinforced resin, the precursor of the core member (I) can be manufactured, for example, by impregnating a discontinuous reinforcing fiber mat with a film or a nonwoven fabric of a thermoplastic resin while the film or the nonwoven fabric is compressed. The discontinuous reinforcing fiber mat is manufactured, for example, by previously dispersing discontinuous reinforcing fibers in a strand form, preferably in a substantially single fiber form, and more preferably in a single fiber form. More specific examples of the method of manufacturing the discontinuous reinforcing fiber mat include dry processes such as an airlaid method in which discontinuous reinforcing fibers are dispersed with an air flow and formed into a sheet and a carding method in which discontinuous reinforcing fibers are formed into a sheet while mechanically combed, and a wet process by the Radright method in which discontinuous reinforcing fibers are stirred in water and made into paper.

Examples of the method of forming discontinuous reinforced fibers into a form closer to a single fiber form include, in the dry processes, a method in which fiber-opening bars are provided, a method in which fiber-opening bars are vibrated, a method in which a card having fine meshes is used, and a method in which the rotation speed of a card is adjusted. In the wet processes, the examples include a method in which the conditions for stirring discontinuous reinforcing fibers are adjusted, a method in which the concentration of reinforcing fibers in a dispersion liquid is reduced, a method in which the viscosity of a dispersion liquid is adjusted, and a method in which a vortex flow is suppressed when a dispersion liquid is transferred. The discontinuous reinforcing fiber mat is particularly preferably manufactured with a wet process, and thus the proportion of the reinforcing fibers in the discontinuous reinforcing fiber mat can be easily adjusted by increasing the concentration of input fibers or adjusting the flow speed (flow rate) of the dispersion liquid and the speed of the mesh conveyor. For example, decreasing the speed of the mesh conveyor with respect to the flow speed of the dispersion liquid makes the orientation of the fibers in the discontinuous reinforcing fiber mat obtained less likely to be directed toward the pulling direction, and thus a bulky discontinuous reinforcing fiber mat can be manufactured. The discontinuous reinforcing fiber mat may include discontinuous reinforcing fibers only, a mixture of discontinuous reinforcing fibers with a matrix resin component having a powder or fiber form, a mixture of discontinuous reinforcing fibers with an organic or inorganic compound, or discontinuous reinforcing fibers that are bonded to each other with a resin component.

The pressure during impregnation of the discontinuous reinforcing fiber mat with a film or nonwoven fabric of a thermoplastic resin is preferably 0.5 MPa or more and 30 MPa or less, and more preferably 1 MPa or more and 5 MPa or less. If the pressure is less than 0.5 MPa, the discontinuous reinforcing fiber mat may be not impregnated with a thermoplastic resin, and if the pressure is more than 30 MPa, it is difficult to adjust the thickness of the precursor of the core member. The temperature during impregnation with a film or nonwoven fabric of a thermoplastic resin is preferably equal to or higher than the melting point or glass transition point of the thermoplastic resin, more preferably equal to or higher than a temperature higher than the melting point or glass transition point by 10° C., and still more preferably equal to or higher than a temperature higher than the melting point or glass transition point by 20° C. If the temperature during impregnation with a film or nonwoven fabric of a thermoplastic resin is excessively higher than the melting point or glass transition point of the thermoplastic resin, the thermoplastic resin may decompose or deteriorate, and therefore the temperature during the impregnation is preferably equal to or lower than a temperature higher than the melting point or glass transition point of the thermoplastic resin by 150° C.

As equipment to perform the method of impregnating the discontinuous reinforcing fiber mat with a film or nonwoven fabric of a thermoplastic resin, a compression molding machine or a double belt press machine can be suitably used. The compression molding machine is a batch type machine, and the productivity can be improved by employing an intermittent type press system including two or more machines for heating and cooling in combination. The double belt press machine is a continuous type machine that can easily perform continuous processing, and thus is excellent in continuous productivity.

The precursor of the fiber-reinforced member (II) usually refers to a prepreg including reinforcing fibers and a resin. Examples of the prepreg include unidirectional fiber prepregs or woven fiber prepregs reinforced with continuous fibers, and laminated bodies of a reinforcing fiber sheet and a resin sheet.

The methods [1] to [3] each include a step of heat-pressing. In this step, a precursor of the core member (I) is disposed on at least one surface and at least one end face of the thermally conductive member (III), and the resulting product is heat-pressed at an expansion temperature of the precursor of the core member (I) or a temperature required for bonding, and thus the core member can contain the thermally conductive member. As equipment for the heat-pressing, a compression molding machine can be suitably used. The compression molding machine is a batch type machine, and the productivity can be improved by employing an intermittent type press system including two or more machines for heating and cooling in combination.

In the method [1], the core member (I) is made to contain the thermally conductive member (III) in the molding process of the core member (I), and then the fiber-reinforced members (II) are bonded to both surfaces of the molded core member (I) respectively. The method of bonding the core member (I) and each fiber-reinforced member (II) together is not particularly limited, and examples of the method include methods in which the core member (I) and each fiber-reinforced member (II) are bonded together by hot plate welding, vibration welding, ultrasonic welding, laser welding, resistance welding, induction heating welding, or an adhesive. The method [1] can be preferably used, for example, in a case where the molding condition such as the molding temperature or the molding pressure of the core member (I) and that of the fiber-reinforced member (II) are greatly different from each other.

The method [2] includes molding and bonding the core member (I) and the fiber-reinforced members (II) simultaneously. The method [2] can be preferably used, for example, in a case where the molding condition such as the molding temperature or the molding pressure of the core member (I) and that of the fiber-reinforced member (II) are similar to each other. The method [2] is preferable from the viewpoint of productivity because molding and bonding of the core member (I) and the fiber-reinforced members (II) can be performed simultaneously.

In the method [3], the core member (I) is made to contain the thermally conductive member (III) in the molding process of the core member (I), then precursors of the fiber-reinforced members (II) are disposed on both surfaces of the molded core member (I) respectively, and the resulting product is heat-pressed. The method [3] is preferable from the viewpoint of productivity because bonding of the core member (I) and the fiber-reinforced members (II) and molding of the fiber-reinforced members (II) can be performed simultaneously.

<Housing>

The housing of the present invention includes the sandwich structure of the present invention. By using the sandwich structure of the present invention, a housing having both an excellent mechanical property and an excellent lightweight property can be obtained. Such a housing is preferable also from the viewpoint of mass productivity because it can be molded by high-cycle molding such as press molding.

The housing of the present invention can be obtained, for example, by producing a sandwich structure having a desired housing form with the above-described method for manufacturing the sandwich structure.

EXAMPLES

Hereinafter, the present invention will be described in more detail with reference to Examples.

(1) Measurement of Flexural Strength and Flexural Modulus of Sandwich Structure

Flexural properties of a flexural test specimen of the produced sandwich structure were measured in accordance with the method of ISO 178 (1993). The flexural direction was set in the fiber direction of the outermost surface of the flexural test specimen, and the flexural strength and the flexural modulus were obtained by calculating the average values of results of five measurements. As a measuring apparatus, "Instron" (registered trademark) 5565 universal material testing machine manufactured by Instron Japan Co., Ltd. was used.

(2) Evaluation of Heat Dissipation Property of Sandwich Structure

Figure 3:
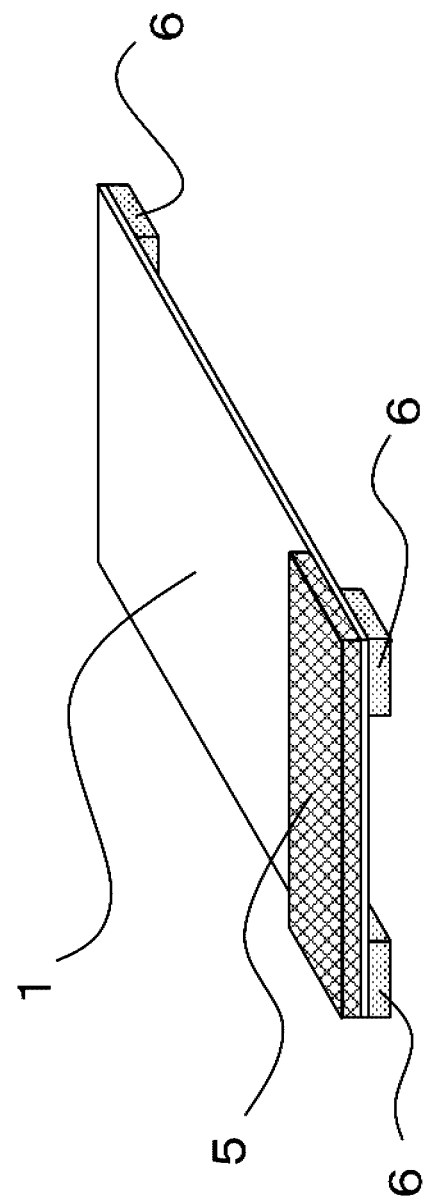
FIG. 3 is a schematic view illustrating a state of evaluation of the heat dissipation property.

As shown in FIG. 3, on the back surface of the produced sandwich structure 1, rubber spacers 6 each having a size of 10 mm×10 mm and a thickness of 3 mm were attached to four corners of the sandwich structure 1 respectively, and the sandwich structure 1 was placed on a test stand. On the surface of the placed sandwich structure, a micro ceramic heater 5 having a size of 50 mm×25 mm (MICRO CERAMIC HEATER MS-2 (trade name) manufactured by SAKAGUCHI E. H VOC CORP.) was placed on one corner of the sandwich structure, and the heater was heated at 10 W under constant current and constant voltage. The heat dissipation property was evaluated from the heater temperature when the heater temperature became constant after 15 minutes from the start of heating the heater in accordance with the following criteria.

A: Heater temperature is lower than 100° C. (heat dissipation property is very high)
B: Heater temperature is 100° C. or higher and lower than 120° C. (heat dissipation property is high)
C: Heater temperature is 120° C. or higher (heat dissipation property is low)

(Reference Example 1) Production of Carbon Fiber Bundle

A polymer with polyacrylonitrile as a main component was subjected to spun processing and calcined processing to obtain a continuous carbon fiber bundle having a total number of filaments of 12,000. A sizing agent was applied to the continuous carbon fiber bundle with an immersion method, and the continuous carbon fiber bundle was dried in the air heated at a temperature of 120° C. to obtain a carbon fiber bundle. This carbon fiber bundle had the following properties.

Single fiber diameter: 7 μm
Mass per unit length: 0.8 g/m
Density: 1.8 g/cm$^3$
Tensile strength: 4.2 GPa
Tensile elastic modulus: 230 GPa
Kind of sizing agent: polyoxyethylene oleyl ether
Adhesion amount of sizing agent: 1.5% by mass (Reference Example 2) Production of Carbon Fiber Mat The carbon fiber bundle in Reference Example 1 was cut into a fiber length of 6 mm with a cartridge cutter to obtain a chopped carbon fiber bundle. An aqueous dispersion of 0.1% by mass of a surfactant (Polyoxyethylene Lauryl Ether (trade name) manufactured by NACALAI TESQUE, INC.) was produced, and the aqueous dispersion and the chopped carbon fiber bundle were put into a paper machine, and thus a carbon fiber mat was produced.

The paper machine includes a dispersion tank, a paper-making tank, and a transferring part that connects the dispersion tank and the paper-making tank. The dispersion tank is equipped with a stirrer, and can disperse a dispersion and a chopped carbon fiber bundle that are put into the tank. The paper-making tank includes a mesh conveyor having a paper-making surface at the bottom. To the mesh conveyor, a conveyor capable of conveying a carbon fiber mat obtained by papermaking is connected. Papermaking was performed at a fiber concentration in the dispersion of 0.05% by mass. The carbon fiber mat obtained by papermaking was dried in a drying furnace at 200° C. Subsequently, the upper surface portion of the carbon mat to be conveyed by the conveyor was sprayed with an aqueous dispersion of 3% by mass of a binder ("POLYMENT" (registered trademark) SK-1000 manufactured by NIPPON SHOKUBAI CO., LTD.) as a binder. The excess binder was sucked, and the resulting mat was dried in a drying furnace at 200° C. to obtain a carbon fiber mat. The obtained carbon fiber mat had a basis weight of 50 g/m².

(Reference Example 3) Production of Polypropylene Resin Film

Two resins of 90% by mass of an unmodified polypropylene resin ("Prime Polypro" (registered trademark) J105G manufactured by Prime Polymer Co., Ltd.) and 10% by mass of an acid-modified polypropylene resin ("ADMER" (registered trademark) QE510 manufactured by Mitsui Chemicals, Inc.) were blended. This blended product was melt-kneaded with an extruder and then extruded from a T-shaped die. After that, the extruded resin was taken up with a chill roll at 60° C., and cooled and solidified to obtain a polypropylene resin film.

(Reference Example 4) Production of Epoxy Resin Film

An epoxy resin (base resin: dicyandiamide/dichlorophenylmethylurea-curing epoxy resin) was applied to release paper using a coater to obtain an epoxy resin film.

(Reference Example 5) Production of Unidirectional Prepreg

The carbon fiber bundle in Reference Example 1 was arranged in one direction in the form of a sheet, both surfaces of the carbon fiber bundle were covered with two epoxy resin films in Reference Example 4 respectively, the resulting product was heated and pressurized and thus impregnated with a resin to obtain a unidirectional prepreg having a carbon fiber basis weight of 110 g/m², a thickness of 0.1 mm, and a matrix resin mass fraction of 30% by mass.

Example 1

The carbon fiber mat in Reference Example 2, the polypropylene resin film in Reference Example 3, the unidirectional prepreg in Reference Example 5, and a graphite sheet ("PGS" (registered trademark) EYGS182307 manufactured by Panasonic Corporation, in-plane thermal conductivity: 1,000 W/m·K) were used to produce a sandwich structure. The carbon fiber mat, the polypropylene resin film, and the unidirectional prepreg were adjusted to have a size of 50 mm×150 mm, the graphite sheet was adjusted to have a size of 40 mm×140 mm, and then they were stacked into a laminate in the order of [unidirectional prepreg 0°/unidirectional prepreg 90°/polypropylene resin film/carbon fiber mat/graphite sheet/carbon fiber mat/polypropylene resin film/unidirectional prepreg 90°/unidirectional prepreg 0°] so that the fiber direction of the unidirectional prepreg on the surface was the longitudinal direction of the sample. At this time, the graphite sheet was disposed in the center of the laminated body. The laminated body was sandwiched between release films, and further sandwiched between tool plates. The resulting product was put into a press molding machine having a plate surface temperature of 180° C., and heat-pressed at 3 MPa for 10 minutes to cure the prepreg and impregnate the carbon fiber mat with the polypropylene resin. Next, a spacer having a thickness of 1 mm was inserted between the tool plates, the resulting product was put into a press molding machine having a plate surface temperature of 40° C., and cooled and pressed at a surface pressure of 3 MPa until the laminated body was cooled, and thus a sandwich structure was obtained in which a core member was disposed around a thermally conductive member. The thickness of the sample was measured with a micrometer, and as a result, the thickness was 1.0 mm. Inserting a spacer having a thickness of 1.0 mm between the tool plates causes spring back of the carbon fiber mat impregnated with the polypropylene resin, and thus the core member becomes a porous body. Note that the sample in this example is a flat plate and thus has a constant thickness. Therefore, the thickness measured at any point of the sample is the maximum thickness. The same applies to other Examples and Comparative Examples.

Figure 4:
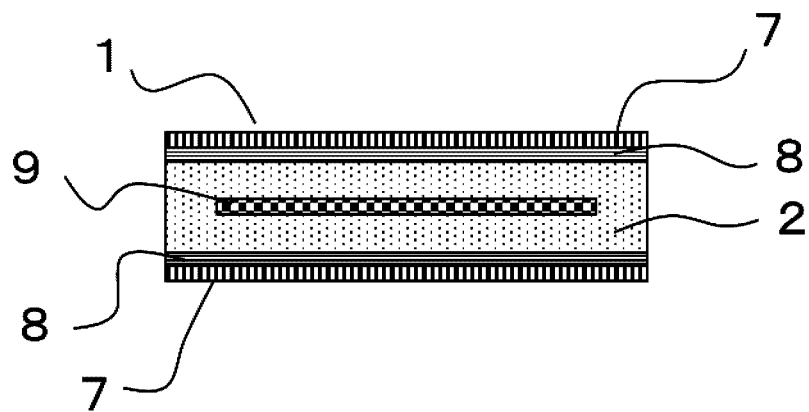
FIG. 4 is a schematic sectional view of a sandwich structure produced in Example 1.

Preforming and press molding of a flexural test specimen were performed in the same manner as described above except that the carbon fiber mat, the polypropylene resin film, and the unidirectional prepreg were adjusted to have a size of 50 mm×40 mm, and that the graphite sheet was adjusted to have a size of 40 mm×30 mm, and thus a flexural test specimen of a sandwich structure was obtained in which a core member was disposed around a thermally conductive member. FIG. 4 shows a sectional view of the obtained sandwich structure. As shown in FIG. 4, the obtained sandwich structure has fiber-reinforced member layers consisting of a unidirectional fiber-reinforced member 0° 7 and a unidirectional fiber-reinforced member 90° 8 on both surfaces of the core member 2, respectively. The graphite sheet 9 has a structure in which both surfaces and all end faces of the graphite sheet 9 are covered with the core member and thus the graphite sheet 9 is protected by the core member. Therefore, the obtained sandwich structure had excellent mechanical properties, and delamination of the graphite sheet and scattering of graphite sheet fragments did not occur. The sandwich structure also had an excellent heat dissipation property because the sandwich structure included the graphite sheet.

Example 2

Figure 5:
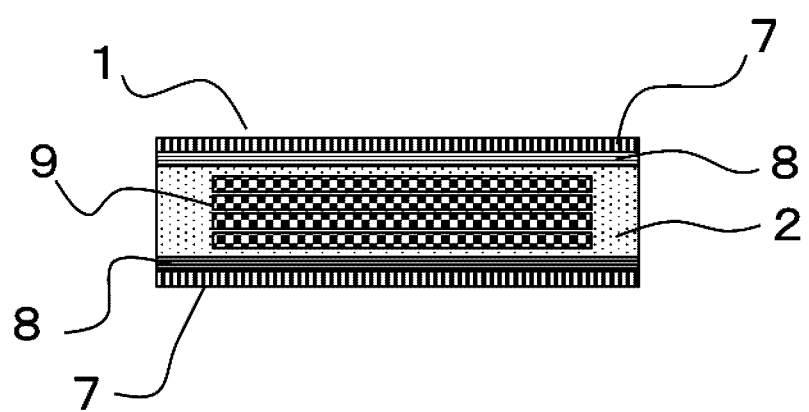
FIG. 5 is a schematic sectional view of a sandwich structure produced in Example 2.

Preforming and press molding of a sandwich structure and a flexural test specimen were performed in the same manner as in Example 1 except that the number of the graphite sheets in the laminate was changed to four, and that the carbon fiber mat, the polypropylene resin film, the unidirectional prepreg, and the graphite sheet were stacked into a laminate in the order of [unidirectional prepreg 0°/unidirectional prepreg 90°/polypropylene resin film/carbon fiber mat/graphite sheet/graphite sheet/graphite sheet/graphite sheet/carbon fiber mat/polypropylene resin film/unidirectional prepreg 90°/unidirectional prepreg 0°], and thus a sandwich structure and a flexural test specimen of a sandwich structure were obtained, in both of which a core member was disposed around a thermally conductive member. FIG. 5 shows a sectional view of the obtained sandwich structure. The obtained sandwich structure had excellent mechanical properties because the graphite sheet was protected by the core member. The sandwich structure also had a very excellent heat dissipation property because the sandwich structure included a plurality of graphite sheets.

Comparative Example 1

Preforming and press molding of a sandwich structure were performed in the same manner as in Example 1 except that the graphite sheet was adjusted to have a size of 50×150 mm, and thus a sandwich structure was obtained in which all ends of a thermally conductive member were exposed. At the time of producing a flexural test specimen, preforming and press molding of a flexural test specimen were performed in the same manner as in Example 1 except that the graphite sheet was adjusted to have a size of 50 mm×40 mm, and thus a flexural test specimen of a sandwich structure was obtained in which all ends of a thermally conductive member were exposed. FIG. 6 shows a sectional view of the obtained sandwich structure. In the obtained sandwich structure, all ends of the graphite sheet were exposed, and therefore delamination occurred between the layers of the graphite sheet.

Comparative Example 2

Preforming and press molding of a sandwich structure were performed in the same manner as in Example 2 except that the graphite sheet was adjusted to have a size of 50×150 mm, and thus a sandwich structure was obtained in which all ends of a thermally conductive member were exposed. At the time of producing a flexural test specimen, preforming and press molding of a flexural test specimen were performed in the same manner as in Example 2 except that the graphite sheet was adjusted to have a size of 50 mm×40 mm, and thus a flexural test specimen of a sandwich structure was obtained in which all ends of a thermally conductive member were exposed. FIG. 7 shows a sectional view of the obtained sandwich structure. The obtained sandwich structure had very low strength, and delamination occurred between the graphite sheets after press molding, so that it was impossible to perform a flexural test and evaluation of the heat dissipation property.

Comparative Example 3

Figure 8:
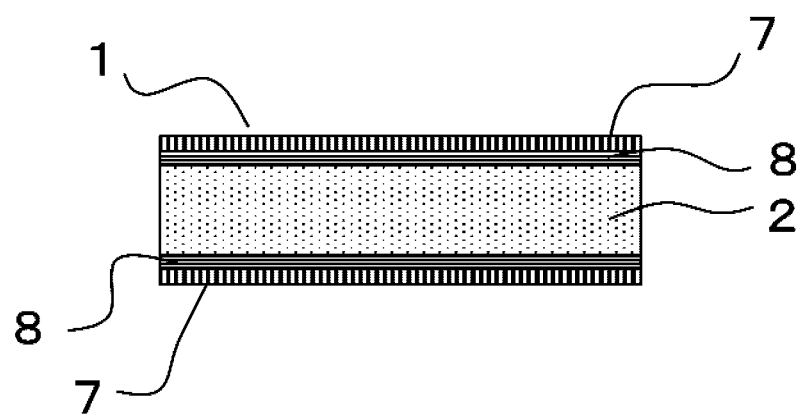
FIG. 8 is a schematic sectional view of a sandwich structure produced in Comparative Example 3.

Preforming and press molding of a sandwich structure were performed in the same manner as in Example 1 except that no graphite sheet was included in the laminate, and thus a sandwich structure including no thermally conductive member was obtained. Also at the time of producing a flexural test specimen, preforming and press molding of a flexural test specimen were performed in the same manner as in Example 1 except that no graphite sheet was included in the laminate, and thus a flexural test specimen of a sandwich structure including no thermally conductive member was obtained. FIG. 8 shows a sectional view of the obtained sandwich structure. The obtained sandwich structure had a low heat dissipation property because the sandwich structure included no thermally conductive member.

INDUSTRIAL APPLICABILITY

The sandwich structure of the present invention can have both an excellent heat dissipation property and an excellent mechanical property. Therefore, it can be applied to a wide range of industrial fields, for example, as a structural member of electrical and electronic equipment, robots, two-wheeled vehicles, automobiles, and aircraft. The sandwich structure can be particularly preferably applied to a housing, of electronic equipment or the like, that is to have a high heat dissipation property.

DESCRIPTION OF REFERENCE SIGNS

1: Sandwich structure
2: Core member (I)
3: Fiber-reinforced member (II)
4: Thermally conductive member (III)
5: Heater
6: Rubber spacer
7: Unidirectional fiber-reinforced member 0°
8: Unidirectional fiber-reinforced member 90°
9: Graphite sheet

The invention claimed is:
1. A sandwich structure comprising:
a core member (I) that includes a porous body;
fiber-reinforced members (II) disposed on both surfaces of the core member (I) respectively; and
a thermally conductive member (III) having a sheet form disposed in the core member (I), wherein the thermally conductive member (III) has an in-plane thermal conductivity of 300 W/m·K or more,
wherein
the core member (I) covers both surfaces and all end faces of the thermally conductive member (III),
the porous body comprises a fiber-reinforced resin that is reinforced with discontinuous fibers that are bonded to each other with a resin at intersections of the discontinuous fibers to form a three-dimensional network,

TABLE 1

|  | Example 1 | Example 2 | Comparative Example 1 | Comparative Example 2 | Comparative Example 3 |
| --- | --- | --- | --- | --- | --- |
| Sample thickness [mm] | 1.0 | 1.0 | 1.0 | 1.0 | 1.0 |
| Thermally conductive member | One graphite sheet | Four graphite sheets | One graphite sheet | Four graphite sheets | — |
| State of end of thermally conductive member | Core member is disposed around end | Core member is disposed around end | All ends are exposed | All ends are exposed | — |
| Flexural strength [MPa] | 732 | 702 | 186 | — | 883 |
| Flexural modulus [GPa] | 60 | 58 | 55 | — | 61 |
| Flexural rigidity per unit width [N · m] | 5.0 | 4.8 | 4.6 | — | 5.1 |
| Heater temperature [° C.] | 109 | 99 | 107 | — | 136 |
| Heat dissipation property [—] | B | A | B | — | C |
| Delamination between layers of graphite sheet [—] | Absent | Absent | Present | Present | — | the discontinuous fibers are coated with the resin at a coverage ratio of 30% or more, and the sandwich structure has a flexural rigidity per unit width of 0.5 N·m or more.

2. The sandwich structure according to claim 1, wherein the thermally conductive member (III) comprises a thermally conductive sheet selected from the group consisting of graphite sheets, metal sheets, and ceramic sheets.

3. The sandwich structure according to claim 2, wherein the thermally conductive member (III) includes a laminated structure of a plurality of the thermally conductive sheets.

4. The sandwich structure according to claim 1, wherein the thermally conductive member (III) is not bonded to the core member (I).

5. The sandwich structure according to claim 1, wherein the porous body consists of a fiber-reinforced resin.

6. The sandwich structure according to claim 1, wherein the fiber-reinforced members (II) include a carbon fiber-reinforced resin.

7. The sandwich structure according to claim 1, having a maximum thickness of 0.3 mm or more and 3.0 mm or less.

8. The sandwich structure according to claim 1, wherein the porous body has a volume content of voids of 10% or more and 85% or less.

9. A housing comprising the sandwich structure according to claim 1.

10. A method for manufacturing the sandwich structure according to claim 1, the method comprising, in order described below, the steps of:
　disposing a precursor of the core member (I) on at least one surface and at least one end face of the thermally conductive member (III) and heat-pressing the precursor and the thermally conductive member (III); and
　bonding the fiber-reinforced members (II) to both surfaces of the core member (I) respectively.

11. A method for manufacturing the sandwich structure according to claim 1, the method comprising, in order described below, the steps of:
　disposing a precursor of the core member (I) on at least one surface and at least one end face of the thermally conductive member (III);
　disposing precursors of the fiber-reinforced members (II) on both surfaces of the precursor of the core member (I) respectively; and
　heat-pressing the precursor of the core member (I), the thermally conductive member (III), and the precursors of the fiber-reinforced members (II).

12. A method for manufacturing the sandwich structure according to claim 1, the method comprising, in order described below, the steps of:
　disposing a precursor of the core member (I) on at least one surface and at least one end face of the thermally conductive member (III) and heat-pressing the precursor and the thermally conductive member (III);
　disposing precursors of the fiber-reinforced members (II) on both surfaces of the core member (I) respectively; and
　heat-pressing the core member (I), the thermally conductive member (III), and the precursors of the fiber-reinforced members (II).

* * * * *